(12) United States Patent  
Park

(10) Patent No.: US 6,998,318 B2
(45) Date of Patent: Feb. 14, 2006

(54) METHOD FOR FORMING SHORT-CHANNEL TRANSISTORS

(75) Inventor: Jeong Ho Park, Icheon-Si (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/627,300

(22) Filed: Jul. 25, 2003

(65) Prior Publication Data
US 2004/0157383 A1 Aug. 12, 2004

(30) Foreign Application Priority Data
Jul. 26, 2002 (KR) .................... 10-2002-0044086

(51) Int. Cl.
*H01L 21/336* (2006.01)
(52) U.S. Cl. .................................. 438/289
(58) Field of Classification Search ............... 438/174, 438/183, 194, 289, 290
See application file for complete search history.

(56) References Cited

U.S. PATENT DOCUMENTS

| 5,856,225 | A  | * | 1/1999  | Lee et al. ............... 438/291 |
| 5,856,226 | A  | * | 1/1999  | Wu ........................ 438/291 |
| 5,960,270 | A  | * | 9/1999  | Misra et al. ............. 438/197 |
| 6,001,695 | A  | * | 12/1999 | Wu ........................ 438/289 |
| 6,114,206 | A  | * | 9/2000  | Yu ......................... 438/270 |
| 6,169,315 | B1 | * | 1/2001  | Son ....................... 257/408 |
| 6,180,468 | B1 | * | 1/2001  | Yu et al. .................. 438/297 |
| 6,214,677 | B1 | * | 4/2001  | Lee ........................ 438/284 |
| 6,245,618 | B1 | * | 6/2001  | An et al. ................. 438/289 |
| 6,319,807 | B1 | * | 11/2001 | Yeh et al. ................ 438/289 |
| 6,406,963 | B1 | * | 6/2002  | Woerlee et al. .......... 438/291 |
| 6,518,113 | B1 | * | 2/2003  | Buynoski ................ 438/291 |
| 6,562,687 | B1 | * | 5/2003  | Deleonibus et al. ...... 438/303 |
| 6,750,519 | B1 | * | 6/2004  | Lin et al. ................ 257/407 |

* cited by examiner

*Primary Examiner*—Matthew Smith
*Assistant Examiner*—Lex H. Malsawma
(74) *Attorney, Agent, or Firm*—Andrew D. Fortney

(57) ABSTRACT

A method for forming short-channel transistors, including removing a residual sacrificial layer pattern used to mask an LDD ion-implant layer through etching; forming second spacers on side walls where the residual sacrificial layer pattern is removed; forming a punch-stop ion implant layer between the second spacers; etching the first oxide layer, and forming a gate insulation layer; and forming a gate where the residual sacrificial layer pattern is removed.

20 Claims, 3 Drawing Sheets

METHOD FOR FORMING SHORT-CHANNEL TRANSISTORS

BACKGROUND OF THE INVENTION

1. Field of the Invention

The present invention relates to a method for forming short-channel transistors, and more particularly to a method for forming transistors having short-channels using a damascene process.

2. Description of the Prior Art

As generally known in the art, in a transistor, since the length of a gate of N-channel Metal Oxide Semiconductor (NMOS) has become to be reduced below 0.14 µm, a short channel effect (SCE) could not be gradually restricted. In order to restrict SCE, effective length of the channel should be basically increased. To this end, a reduction of dose rate in a lightly doped drain (LDD) region is effective.

However, the reduction of dose rate in an LDD region causes a degradation of a device by hot carrier effects because of a reduction of an effect of electric field relief, and causes a reduction of through-current because of an increase of resistance of LDD region, which makes it difficult to obtain high performance products.

Meanwhile, in order to form an LDD region, an implantation of P or As ions can be conducted whereby a degradation of a device by hot carrier effects may be effectively prevented, but the horizontal and vertical extensions of an LDD by an implantation of P ions are large to a great extent because a diffusion by an annealing treatment is larger than that by As ion implantation.

Generally, dose rate of ion implants to sufficiently secure device performance (i.e., capable of reducing resistance of an LDD region) is above $3 \times 10^{13}/cm^2$, which dose rate corresponds to high dose rate in a 0.14 µm-class technology, causing a problem in that an SCE cannot be restricted.

Also, where As ions are adapted as implant impurities of an LDD region, diffusion by an annealing treatment is very smaller than that by P ion implantation, which effectively restricts an SCE. Nevertheless resistance of an LDD region can be reduced sufficient to secure through-current of a device, there is provided a problem in that hot carrier feature is worse than that in P implanted LDD region.

SUMMARY OF THE INVENTION

Accordingly, the present invention has been made to solve the above-mentioned problems occurring in the prior art, and an object of the present invention is to provide a method for forming short-channel transistors having excellent characteristics through a reduction of short-channel effect.

In order to accomplish this object, there is provided a method for forming short-channel transistors, the method comprising the steps of: forming a first oxide layer and a sacrificial layer one after another on a semiconductor substrate and etching the sacrificial layer, thus forming a residual sacrificial layer pattern; conducting an ion implantation using the residual sacrificial layer pattern as a mask, thus forming an LDD ion-implant layer in the semiconductor substrate; forming the first spacers on both side walls of the residual sacrificial layer pattern; conducting an ion implantation using the residual sacrificial layer pattern and the first spacers as a mask, thus forming a source/drain ion-implant layer under the LDD ion-implant layer; forming a nitride layer and a second oxide layer one after another on the whole surface of the former resultant object and conducting an annealing treatment, thus forming source/drain regions; conducting chemical-mechanical polishing (CMP) processes to the extent that an upper surface of the residual sacrificial layer pattern is exposed, and removing the residual sacrificial layer pattern through etching; forming the second spacers on side walls of a portion where the residual sacrificial layer patter is removed; conducting an ion implantation on the substrate between the second spacers, thus forming a punch-stop ion implant layer; etching the first oxide layer under the portion where the residual sacrificial layer pattern is removed, and forming a gate insulation layer; and forming a gate on the portion where the residual sacrificial layer pattern is removed.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
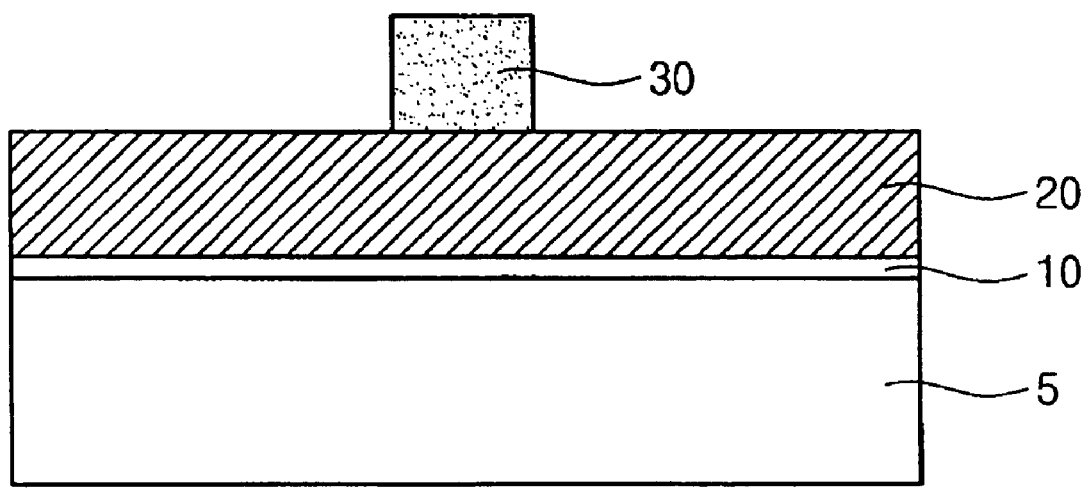
FIGS. 1A to 1E are end views showing a forming method of short-channel transistors of the present invention according to every process.

Hereinafter, a preferred embodiment of the present invention will be described with reference to the accompanying drawings. In the following description and drawings, the same reference numerals are used to designate the same or similar components, and so repetition of the description of the same or similar components will be omitted.

FIGS. 1A to 1E are end views showing a forming method of short-channel transistors of the present invention according to every processes.

First, as shown in FIG. 1A, a first oxide layer 10 and a polysilicon sacrificial layer 20 are serially deposited on a semiconductor substrate 5, and a mask pattern 30 is formed thereon.

Figure 1B:
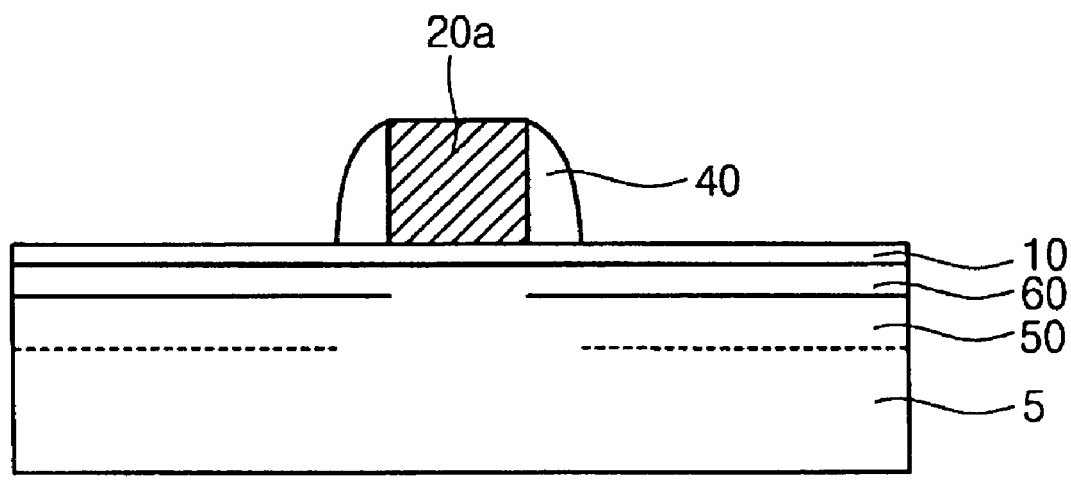

Then, as shown in FIG. 1B, the polysilicon sacrificial layer 20 is dry-etched using the mask pattern 30 to form a residual sacrificial layer 20a. An LDD ion implant layer 60 is found on a source/drain ion implant layer to be subsequently formed, using an ion implantation upon LDD ion implanting. Also, the first oxide layer can be used as an etch stopper layer.

Then, a first spacer layer (not shown) is deposited and etched on the whole surface thereof, thus forming the first spacers 40 on both side walls of the residual sacrificial layer 20a. The first spacer layer can be a nitride layer and the first spacers 40 can be composed of the same material as the second spacers to be formed at subsequent procedure.

Then, an ion implantation is conducted using the residual sacrificial layer 20a and the first spacers 40 as a mask, thus forming the source/drain ion implant layer 50 in the semiconductor substrate 5 under around the residual sacrificial layer. Herein, the source/drain ion implant layer 50 is formed under the LDD ion implant layer 60. Upon source/drain ion implanting, the first oxide layer 10 is used as a buffer layer for the ion implantation.

Figure 1C:
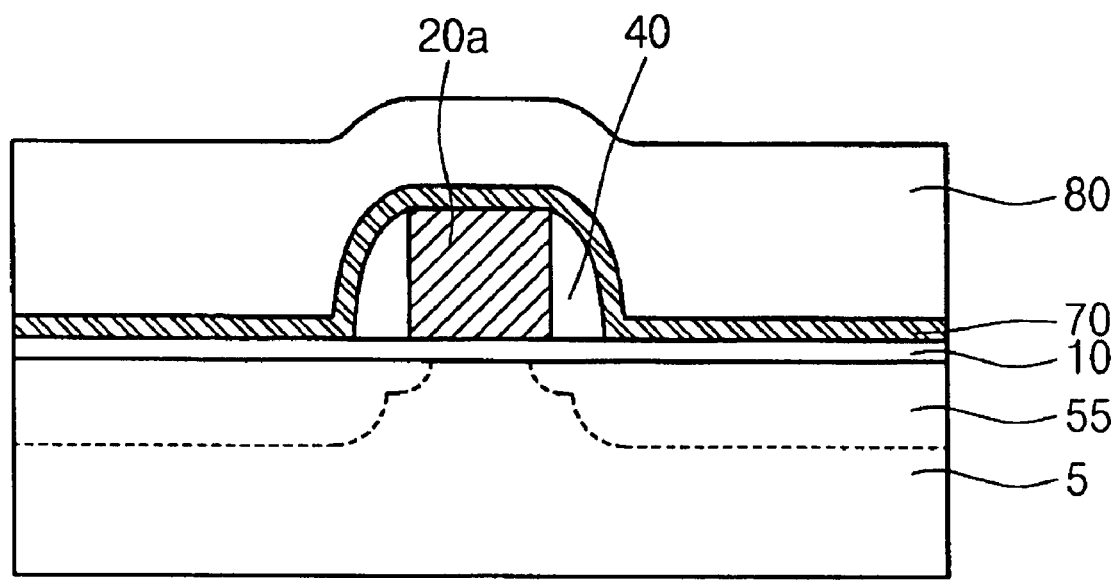

Then, as shown in FIG. 1C, on the whole surface of the former resultant object, a nitride layer 70 and a second oxide layer 80 are successively deposited. In this case, the second oxide layer 80 can be multi-layered.

Then, an annealing treatment is conducted to the LDD ion implant layer 60 and the source/drain ion implant layer 50, forming source/drain regions 55.

Figure 1D:
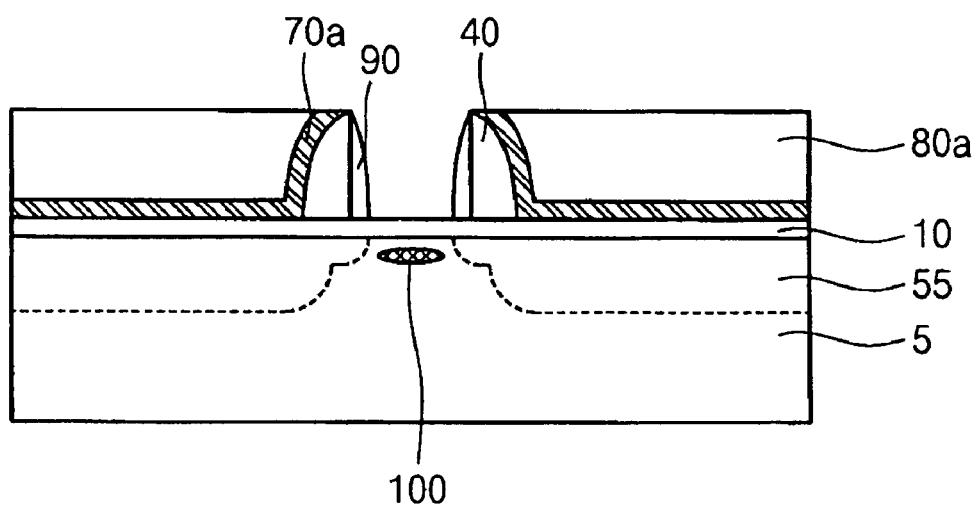

Then, as shown in FIG. 1D, CMP process is conducted to the second oxide layer 80 and the nitride layer 70, to the extent that the upper surface of the residual sacrificial layer 20a is exposed, so as to planarize the same, thus forming a second oxide layer 80a and a nitride layer 70a as shown in the drawing.

Then, wet-etching procedure is conducted to the whole surface of the former resultant object to completely remove the residual sacrificial layer 20a. Herein, upon etching the residual sacrificial layer 20a, the first oxide layer 10 is used as an etch stopper layer.

Then, a second spacer layer is deposited on the whole surface of the former resultant object and is etched, so that the second spacers 90 are formed on both side walls of the first spacers 40 where the residual sacrificial layer is removed. Herein, the second spacer layer can be a nitride layer and the second spacers 90 can be composed of the same material as the first spacers 40.

Then, an ion implantation is conducted between the source/drain regions 55 under a portion where a gate is formed later, thus forming a punch-stop ion implant layer 100. Herein, the punch-stop ion implant layer 100 can be adapted as a threshold-voltage Vth adjustment ion implant layer.

Figure 1E:
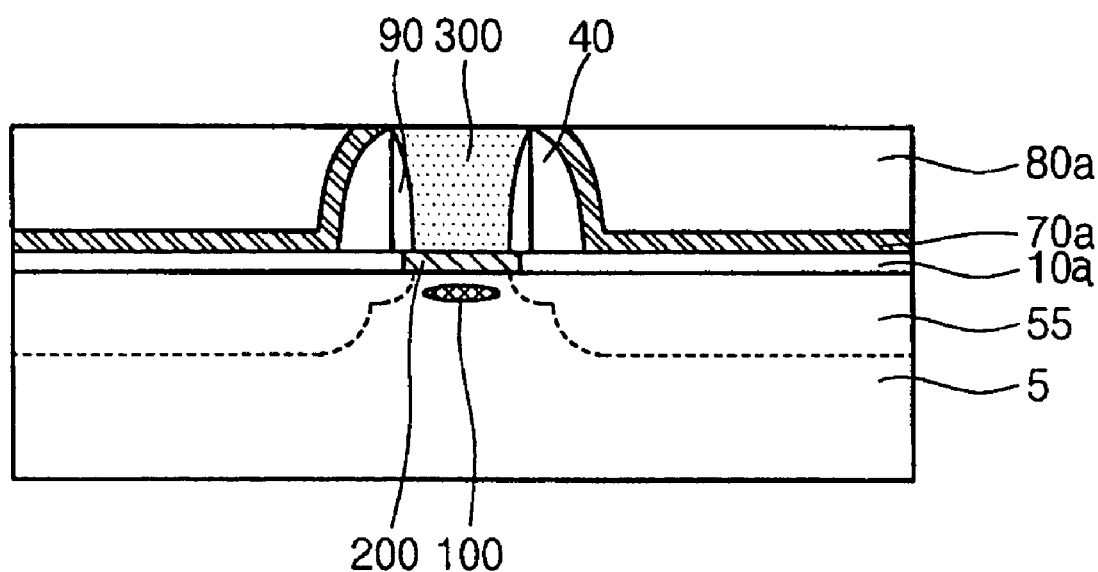

Then, as shown in FIG. 1E, the first oxide layer 10 under the gate-forming portion is wet-etched to form a first residual oxide layer 10a and a gate insulation layer 200.

Finally, a polysilicon layer is deposited on the whole surface of the structure including the gate-forming portion and is planarized to form a gate 300 in the gate-forming portion using the residual sacrificial layer 20a and the first spacers 40 as a mask, thus forming the source/drain ion implant layer 50 in the semiconductor substrate 5 under around the residual sacrificial layer.

According to the present invention as described above, in a forming method of transistors, short-channel transistors are formed using a spacer by a damascene method after previously forming the source/drain regions, thus reducing short channel effects (SCE) and a drain induced barrier lowering (DIBL) of the transistors, which makes it possible to fabricate transistors having excellent characteristics.

Also, by a forming method of transistors of the present invention, transistors having channels shorter than by other similar fabricating processes are provided.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for forming short-channel transistors, comprising the steps of:
    forming a first oxide layer and a sacrificial layer one after another on a semiconductor substrate and etching the sacrificial layer thus forming a residual sacrificial layer pattern;
    conducting an ion implantation using the residual sacrificial layer pattern as a mask, thus forming an LDD ion-implant layer in the semiconductor substrate;
    forming first spacers on both side walls of the residual sacrificial layer pattern;
    conducting an ion implantation using the residual sacrificial layer pattern and the first spacers as a mask, thus forming a source/drain ion-implant layer under the LDD ion-implant layer;
    forming a nitride layer and a second oxide layer one after another on the whole surface of the former resultant object and conducting an annealing treatment, thus forming source/drain regions;
    conducting a chemical-mechanical polishing (CMP) process to the extent that an upper surface of the residual sacrificial layer pattern is exposed, and removing the residual sacrificial layer pattern through etching;
    forming second spacers on side walls of a portion where the residual sacrificial layer pattern is removed;
    conducting an ion implantation on the substrate between the second spacers and through the first oxide layer, thus forming a punch-stop ion implant layer;
    etching the first oxide layer under the portion where the residual sacrificial layer pattern is removed, and forming a gate insulation layer having a thickness sufficient to reach the second spacers; and
    forming a gate on the second spacers and the gate insulation layer where the residual sacrificial layer pattern is removed.

2. The method for forming short-channel transistors as claimed in claim 1, wherein upon etching the sacrificial layer, the first oxide layer is used as an etch stopper layer.

3. The method for forming short-channel transistors as claimed in claim 1, wherein the gate insulation layer and the gate are formed after the source/drain regions are previously formed.

4. The method for forming short-channel transistors as claimed in claim 1, wherein the sacrificial layer consists essentially of polysilicon.

5. The method for forming short-channel transistors as claimed in claim 1, wherein the second oxide layer is multi-layered.

6. The method for forming short-channel transistors as claimed in claim 1, wherein the punch-stop ion implant layer is adapted as a threshold-voltage adjustment ion implant layer.

7. The method for forming short-channel transistors as claimed in claim 1, wherein upon ion implantation of LDD and the source/drain, the first oxide layer is used as a buffer layer for ion implantation.

8. The method for forming short-channel transistors as claimed in claim 1, wherein the first and second spacers comprise the same materials.

9. The method for forming short-channel transistors as claimed in claim 1, wherein the first and second spacers each consist essentially of a nitride layer.

10. The method for forming short-channel transistors as claimed in claim 8, wherein the first and second spacers each consist essentially of a nitride layer.

11. The method for forming short-channel transistors as claimed in claim 1, wherein the sacrificial layer consists essentially of polysilicon.

12. The method for forming short-channel transistors as claimed in claim 1, wherein removing the residual sacrificial layer pattern comprises wet etching to residual sacrificial layer pattern.

13. The method for forming short-channel transistors as claimed in claim 1, wherein upon etching the residual sacrificial layer pattern, the first oxide layer is used as an etch stopper layer.

14. A method for forming short-channel transistors, comprising the steps of:
    on a semiconductor substrate having a first oxide layer thereon, a residual sacrificial layer pattern on the first oxide layer, first spacers on side walls of the residual sacrificial layer pattern, an LDD ion-implant layer in the semiconductor substrate not masked by the residual sacrificial layer pattern, a source/drain ion-implant layer under the LDD ion-implant layer not masked by the first spacers, and a nitride layer and a second oxide layer on the surface thereof, removing to residual sacrificial layer pattern by etching, using the first oxide layer as an etch stopper;

forming second spacers on side walls of the first spacers;

forming a punch-stop layer on the substrate by ion implantation between the second spacers and through the first oxide layer;

etching the exposed first oxide layer, and forming a gate insulation layer having a thickness sufficient to reach the second spacers; and forming a gate on the gate insulation layer and the second spacers.

15. The method for forming short-channel transistors as claimed in claim 14, further comprising, prior to the residual sacrificial layer pattern removing step, chemical-mechanical polishing the nitride layer and second oxide layer to planarize the nitride layer and second oxide layer and expose an upper surface of the residual sacrificial layer pattern.

16. The method for forming short-channel transistors as claimed in claim 14, wherein the sacrificial layer consists essentially of polysilicon.

17. The method for forming short-channel transistors as claimed in claim 14, wherein The first spacers consist essentially of a nitride layer.

18. The method for forming short-channel transistors as claimed in claim 17, wherein the second spacers consist essentially of a nitride layer.

19. The method for forming short-channel transistors as claimed in claim 14, wherein the gate forming step comprises depositing a polysilicon layer on a whole surface of a structure following the gate insulation layer forming step, and planarizing the polysilicon layer to form the gate.

20. The method for forming short-channel transistors as claimed in claim 19, wherein the sacrificial layer consists essentially of polysilicon.

\* \* \* \* \*